(12) United States Patent
Kanemoto

(10) Patent No.: US 7,625,784 B2
(45) Date of Patent: Dec. 1, 2009

(54) SEMICONDUCTOR DEVICE AND METHOD FOR MANUFACTURING THEREOF

(75) Inventor: Kei Kanemoto, Suwa-gun (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/820,320

(22) Filed: Jun. 19, 2007

(65) Prior Publication Data

US 2008/0026511 A1    Jan. 31, 2008

(30) Foreign Application Priority Data

Jul. 26, 2006   (JP) .............................. 2006-202914

(51) Int. Cl.
*H01L 21/00*   (2006.01)
(52) U.S. Cl. .................. 438/149; 438/311; 257/347; 257/E27.122; 257/E21.32
(58) Field of Classification Search ......... 438/149–166, 438/295, 311, 404–413, 458–459, 479–481, 438/967, 257, E21.561–E21.57, E21.7–E21.704
See application file for complete search history.

(56) References Cited

U.S. PATENT DOCUMENTS 7,332,399 B2   2/2008   Kato

FOREIGN PATENT DOCUMENTS

| | | |
|---|---|---|
| JP | 02-205339 A | 8/1990 |
| JP | 2005-354024 A | 12/2005 |
| JP | 2006-108206 A | 4/2006 |
| JP | 2006-210683 A | 8/2006 |

OTHER PUBLICATIONS

T. Sakai et al., Separation by Bonding Si Islands (SBSI) for LSI Applications, Second International SiGe Technology and Device Meeting, Meeting Abstract, May 2004, pp. 230-231.

*Primary Examiner*—Brook Kebede
*Assistant Examiner*—Tony Tran
(74) *Attorney, Agent, or Firm*—AdvantEdge Law Group, LLC

(57) ABSTRACT

The disclosure includes methods of manufacturing a semiconductor device formed on an SOI structure. In one example, a first and second semiconductor layer is formed on a semiconductor substrate including a first region. The first semiconductor layer and the second semiconductor layer are removed from a second region to form a recess for a support. A support precursor layer is formed. A portion of the support precursor layer is removed to form a support coupling the recess and the second semiconductor layer. A part of the first and second semiconductor layer is etched using the support as a mask. The first semiconductor layer is etched and removed to form a cavity under the second semiconductor layer. The second semiconductor layer is thermally oxidized to form a buried insulating layer in the cavity and the support is removed from at least the first region to expose the second semiconductor layer.

4 Claims, 9 Drawing Sheets

SEMICONDUCTOR DEVICE AND METHOD FOR MANUFACTURING THEREOF

BACKGROUND

1. Technical field

Several aspects of the present invention relate to a semiconductor device and a method for manufacturing thereof.

2. Related Art

A field-effect transistor formed on an SOI structure has been drawing attention recently due to its usability in terms of easy element-isolation, no latch-up phenomenon, and small source/drain junction capacitance. Especially, a fully depleted silicon on insulator (SOI) transistor has been studied actively due to its capability of high-speed operation with low power consumption, and simplicity in low-voltage drive.

For example, T. Sakai et al., Second International SiGe Technology and Device Meeting, Meeting Abstract, pp. 230-231, May (2004) discloses a method for forming an SOI structure on a bulk wafer. First, the method forms a single-crystalline silicon-germanium layer and a single-crystalline silicon layer on a single-crystalline silicon substrate by epitaxial growth, and forms recesses on both ends of an element region, that is a region in which the SOI structure is to be formed. Next, an insulating layer formed over the whole surface of the substrate is patterned so as to provide a support supporting the element region to the substrate and formed through the recesses. Then the single-crystalline silicon-germanium layer is selectively etched by hydrofluoric nitric acid to form a cavity, providing a silicon on nothing (SON) structure. Then the single-crystalline silicon substrate and the single-crystalline silicon layer are thermally oxidized to grow silicon oxide films from the top and the bottom of the cavity, providing a buried insulating layer filling up the cavity. Thus, the SOI structure is provided. After the cavity is filled up with the buried insulating layer, the silicon oxide film and the support are planarized by chemical mechanical polishing (CMP), and the single-crystalline silicon layer in the region in which the SOI structure is to be formed is exposed by hydrofluoric acid solution.

However, in the above forming method, the support fixes two opposed sides of the region in which the SOI structure is to be formed, to the substrate, so that stress occurring within the support easily affects the single-crystalline silicon layer in the process of the thermal oxidation of the single-crystalline silicon substrate and the single-crystalline silicon layer. Especially, when compressive stress occurs, the support and the single-crystalline silicon layer warp upward, i.e. warp in a convex shape, so that a gap may be generated at the interface of the silicon oxide films growing from the top and the bottom of the cavity. Therefore, the hydrofluoric acid solution enters the gap in the process of CMP and the process of exposing the single-crystalline silicon layer, so that the single-crystalline silicon layer may be peeled off.

FIGS. 14A to 14C show generation of a gap in forming an SOI structure by the conventional method. FIG. 14A shows a state of a single-crystalline silicon substrate 102 subjected to the following process: forming a single-crystalline silicon-germanium layer which is not shown and a single-crystalline silicon layer 104 provided to a region on which the SOI structure is to be formed; covering the top surface of the single-crystalline silicon layer 104 by a support 108 of which both sides connect with the single-crystalline silicon substrate 102 through recesses 106 for a support so as to support the single-crystalline silicon layer 104; and selectively etching and removing the single-crystalline silicon-germanium layer so as to form a cavity 110 under the single-crystalline silicon layer 104. The removing process of the single-crystalline silicon-germanium layer generates no stress, so that the support 108 does not warp and the single-crystalline silicon layer 104 is flat.

FIG. 14B shows a state of starting thermal oxidation of the single-crystalline silicon layer 104 being the upper layer of the cavity 110 and the single-crystalline silicon substrate 102 being the lower layer of the cavity 110 so as to form a buried insulating layer composed of silicon oxide films in the cavity 110. As a silicon oxide film 112 and the silicon oxide film 113 grow from the above two opposing layers in the cavity, compressive stress 116 occurs within the support 108 by heat. Here, the both sides of the support 108 connect with the single-crystalline silicon substrate 102 through the recesses 106, so that the support 108 can not stretch in the horizontal direction. Further, the support 108 is individually formed, more easily transforming than the single-crystalline silicon substrate 102. Therefore, a force 118 is applied to the support 108 and the single-crystalline silicon layer 104 supported by the support 108 to release the compressive stress 116. Consequently, the support 108 and others start to warp upward, that is archwise.

FIG. 14C shows a state after the completion of the thermal oxidation. Since the support 108 and the single-crystalline silicon layer 104 are thermally oxidized in a manner warping upward, a gap 120 which is thin and arcuate is generated between the silicon oxide film 112 grown on the surface of the single-crystalline silicon layer 104 and the silicon oxide film 113 grown on the surface of the single-crystalline silicon substrate 102. Here, the original purpose is to form the buried insulating layer integrating the above two silicon oxide films. As mentioned later, in order to form the SOI structure, the support 108 is removed by chemical mechanical polishing (CMP) to expose the surface of the single-crystalline silicon layer 104. If hydrofluoric acid etchant enters the gap in the CMP process, the buried insulating layer may be etched to peel off the single-crystalline silicon layer 104 being the upper layer of the buried insulating layer.

SUMMARY

An advantage of the present invention is to prevent the above-mentioned generation of the gap so as to improve quality and yield of the semiconductor device having the SOI structure.

A method for manufacturing a semiconductor device according to one aspect of the invention includes: a) forming a first semiconductor layer which can be etched faster than a semiconductor substrate, on the semiconductor substrate including a first region that is arranged at a predetermined interval and is to be provided with a silicon on insulator (SOI) structure; b) forming a second semiconductor layer etched slower than the first semiconductor layer, on the first semiconductor layer; c) removing the first semiconductor layer and the second semiconductor layer from a second region which is adjacent to the first region via one line and disposed singly to each of the first region, so as to form a recess which exposes the semiconductor substrate, for a support; d) forming a support precursor layer made of insulating material on a region including at least the first region and the second region on the semiconductor substrate; e) etching and removing the support precursor layer except for a part thereof corresponding to the first region and corresponding to a part, including at least the one line, of a bottom part of the recess so as to form a support coupling the recess and the second semiconductor layer; f) etching a part of the first semiconductor layer and the second semiconductor layer by using the support as a mask to expose a first side section of the first semiconductor layer and the second semiconductor layer except for a second side section adjacent to the second region; g) etching and removing the first semiconductor layer selectively to the second semiconductor layer and the semiconductor substrate so as to form a cavity under the second semiconductor layer; h) thermally oxidizing the second semiconductor layer being an upper layer of the cavity and the semiconductor substrate being a lower layer of the cavity so as to form a buried insulating layer composed of a semiconductor oxide film in the cavity; and i) removing the support at least from the first region so as to expose the second semiconductor layer.

The method forms the recess adjacent via one line to the first region in which the SOI structure is to be formed, being able to provide the support which is cantilevered, namely the support connecting with the substrate with its one side part at one side of the first region. In addition, since the buried insulating layer composed of the thermal oxide films is formed in the cavity in such state, the support can prevent its archwise warpage caused by the compressive stress occurring within the support. Thus, the method can prevent generation of the gap in the buried insulating layer, and provide the SOI structure of which the quality and the like are improved, and the semiconductor device formed on the SOI structure.

It is preferable that a planar shape of the first region be rectangular, and the one line be one short side out of four sides defining the first region.

The method forms the recess for a support on one short side part of the first region which is rectangular and the SOI structure is to be formed on, so that the method can reduce an area of the recess to the first region, and improve the ratio of an area of the first region to an area of the semiconductor substrate. Further, since the first semiconductor layer is etched from both long sides, the etchant can easily spread in whole of the first region to easily form the cavity.

The length of the short side is preferably 1.25 µm or less.

When the width of the first region is 1.25 µm or less, the etchant can sufficiently infiltrate to form the cavity more surely. Thus, the method further ensures the insulation of the second semiconductor layer from the semiconductor substrate so as to provide the SOI structure with further improved quality, yield, and the like.

It is preferable that the semiconductor substrate and the second semiconductor layer be made of single-crystalline silicon, and the first semiconductor layer be made of single-crystalline silicon-germanium.

Single-crystalline silicon-germanium can be etched by the hydrofluoric nitric acid etchant selectively to single-crystalline silicon, namely etched faster than single-crystalline silicon, easily forming the cavity. Thus, the method can more easily provide the SOI structure with improved quality, yield, and the like.

It is preferable that the method further include forming a buffer layer made of single-crystalline silicon on the semiconductor substrate before the step of forming a first semiconductor layer on the semiconductor substrate, the cavity being formed between the second semiconductor layer and the buffer layer made of single-crystalline silicon, and the buried insulating layer including thermal oxide of the buffer layer made of single-crystalline silicon.

Forming the buffer layer before the step a) can prevent fine defects and the like on the semiconductor substrate from adversely affecting the first semiconductor layer and the second semiconductor layer. Thus, the method can provide the SOI structure with improved quality, yield, and the like.

A semiconductor device according to the aspect of the invention may be manufactured by the method.

According to such structure, the semiconductor device having capability of high-speed operation in low power consumption, and simplicity in low-voltage drive can be more easily provided.

BRIEF DESCRIPTION OF THE DRAWINGS

The invention will be described with reference to the accompanying drawings, wherein like numbers reference like elements.

DESCRIPTION OF EXEMPLARY EMBODIMENT

An embodiment of the present invention will now be described with reference to the accompanying drawings. Note that the embodiment described hereinafter is a preferred illustrative embodiment including various limitations that are technically preferable, but the range of the invention is not limited to them unless a definition limiting the invention is provided. Further, note that the drawings referred in the description hereinafter use different scales and the like for members and parts from the ones for actual members and parts for convenience sake of drawing.

Embodiment

This embodiment of the present invention will be described with reference to process drawings of FIGS. 1 to 12B. Here, each drawing suffixed with a letter "B" is a plan view, and each drawing suffixed with a letter "A" is a sectional view taken along the line A-A of the each drawing suffixed with the letter "B".

Figure 1:
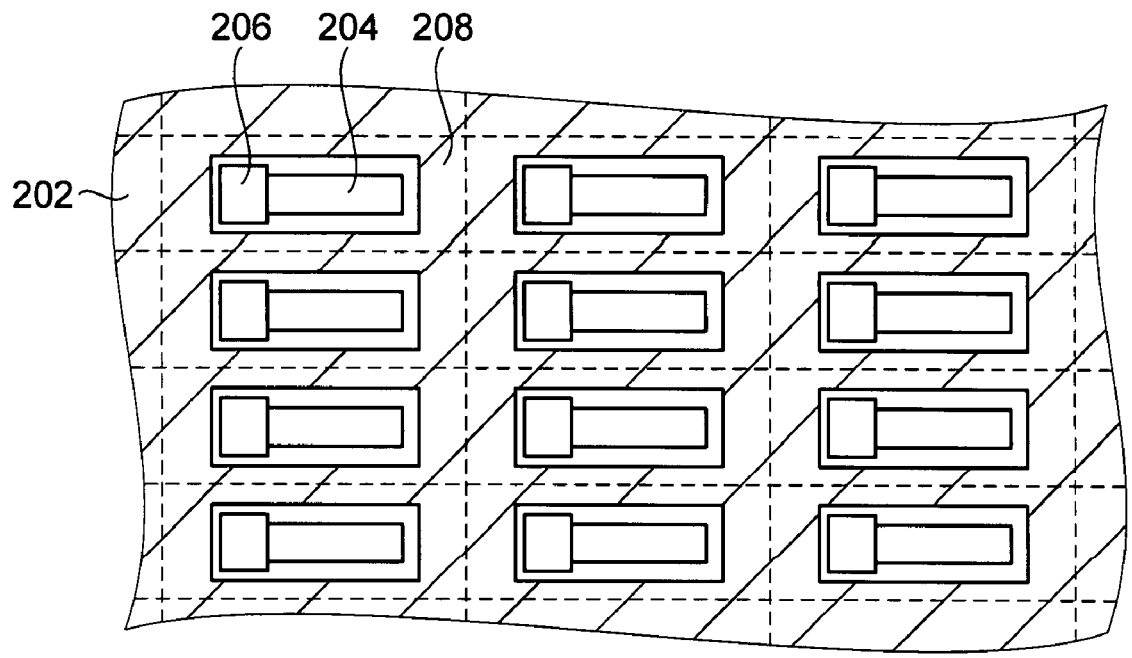
FIG. 1 is a schematic view showing an arrangement of each region on a substrate according to an embodiment of the invention.

FIG. 1 shows an arrangement of each region on a single-crystalline silicon substrate (hereinafter, referred to as a "substrate") 202 as a semiconductor substrate of the embodiment.

On the substrate 202, SOI forming regions 204 as a first region and support recess forming regions 206 as a second region are arranged in matrix at a predetermined interval. LOCOS regions 208 are arranged a lattice like at a predetermined interval from respective peripheries of the SOI forming regions 204 and the support recess forming regions 206. None of the LOCOS region 208, the SOI forming region 204, and the support recess forming region 206 overlap each other.

It is preferable that the SOI forming region 204 be rectangular and a length of a short side thereof be 1.25 µm or less. The length of a long side can be determined depending on a semiconductor device to be formed. The support recess forming region 206 is square, and arranged adjacent to one short side of the SOI forming region 204. An adjacent side of the support recess forming region 206 is preferably a little longer than the short side of the SOI forming region. Dashed lines are border lines between the LOCOS regions 208 arranged in lattice-like, and the plan view of each drawing suffixed with the letter "B" shows a rectangle defined by the dashed lines. Hereinafter, the method for manufacturing a semiconductor device of the embodiment will be described with reference to each process drawing.

Figure 2A:
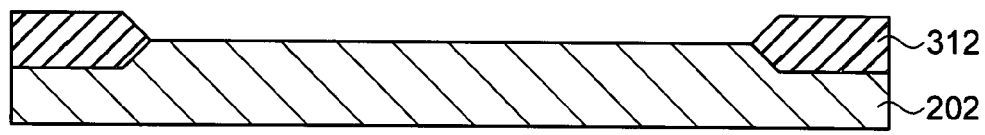
FIGS. 2A and 2B are schematic views showing a process of manufacturing a semiconductor device of the embodiment.
Figure 2B:
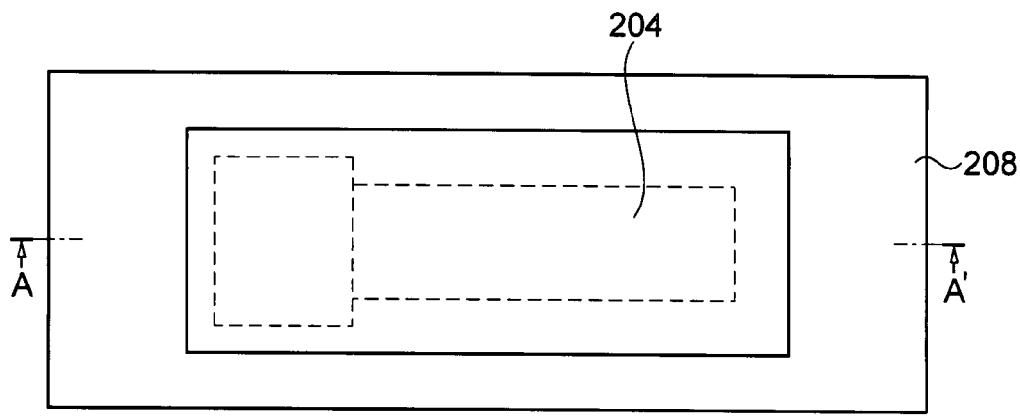

As shown in FIGS. 2A and 2B, an LOCOS layer 312 electrically insulating the SOI forming regions 204 from each other is formed on the LOCOS region 208. The LOCOS layer 312 is formed by a known method using a silicon nitride film formed in a region other than the LOCOS region 208 on the substrate 202, as a mask.

Figure 3A:
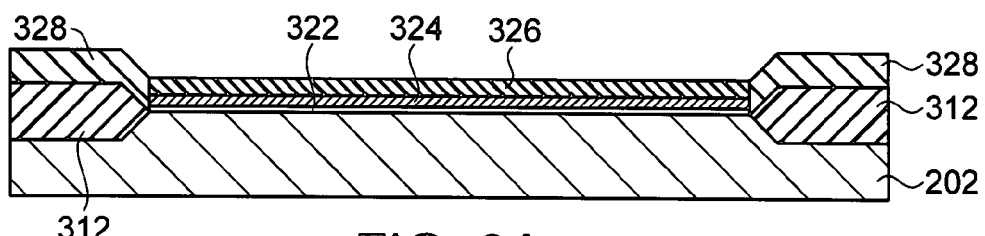
FIGS. 3A and 3B are schematic views showing a process of manufacturing a semiconductor device of the embodiment.
Figure 3B:
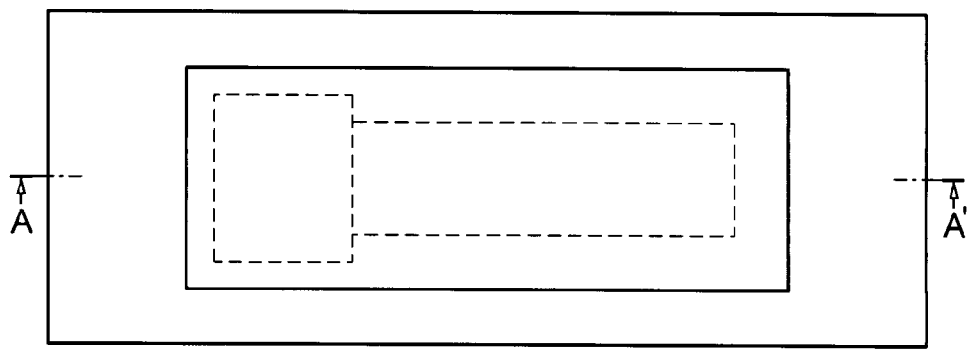

As shown in FIGS. 3A and 3B, over the whole top surface of the substrate 202, a single-crystalline silicon layer (hereinafter, referred to as a"buffer layer") 322 as a buffer layer having a thickness of 20 nm, a single-crystalline silicon-germanium layer 324 as a first semiconductor layer having a thickness of 30 nm, and a single-crystalline silicon layer 326 as a second semiconductor layer having a thickness of 100 nm are formed in this order from a bottom layer by epitaxial growth. Since a lower layer of the LOCOS layer 312 is not single crystal, a semiconductor layer including the above three layers on the LOCOS layer 312 is polycrystalline, but there is no problem in the embodiment. The semiconductor layer on the LOCOS layer 312, that is a polycrystalline layer including the three layers is called a polycrystalline silicon layer 328 hereinafter.

Figure 4A:
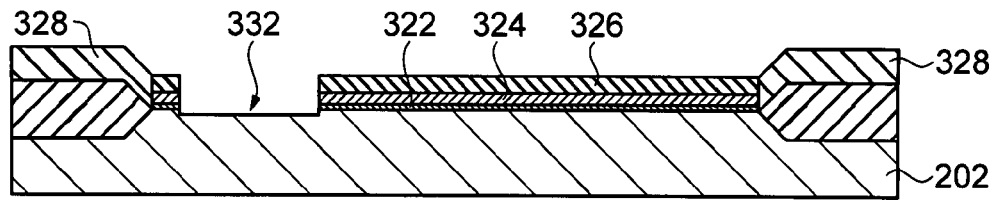
FIGS. 4A and 4B are schematic views showing a process of manufacturing a semiconductor device of the embodiment.
Figure 4B:
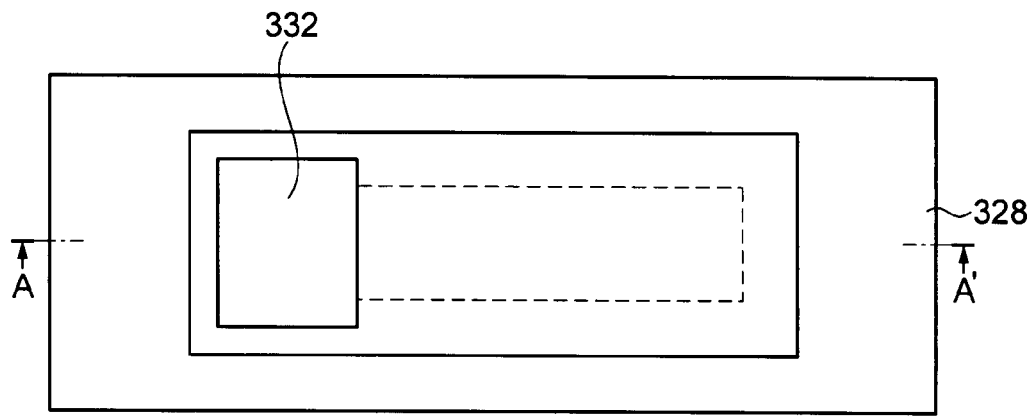

As shown in FIGS. 4A and 4B, a part, in the support recess forming region 206, of a three-layered single-crystalline thin film including the single-crystalline silicon layer 326, the single-crystalline silicon-germanium layer 324, and the buffer layer 322 mentioned above is removed by photolithography (a resist is exposed to light and developed to be patterned, and a region other than a region on which the resist is formed is etched by using the resist as a mask), forming a recess 332 for a support. The recess 332 exposes the surface of the substrate 202. As mentioned above, in the planer shape, the recess 332 is wider than the short side of the SOI forming region 204. Here, when forming the recess 332, the substrate 202 is also slightly etched at the bottom of the recess 332, but there is no problem.

Figure 5A:
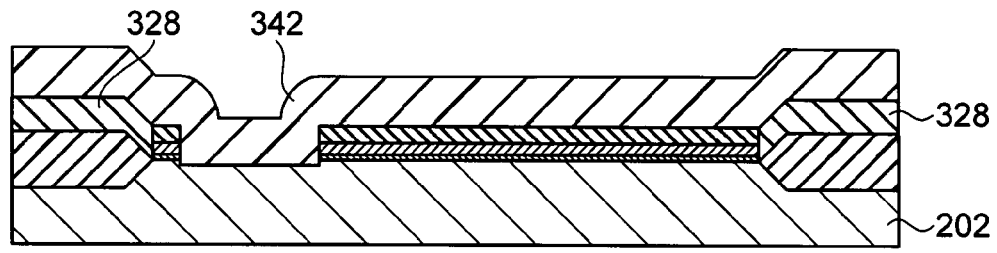
FIGS. 5A and 5B are schematic views showing a process of manufacturing a semiconductor device of the embodiment.
Figure 5B:
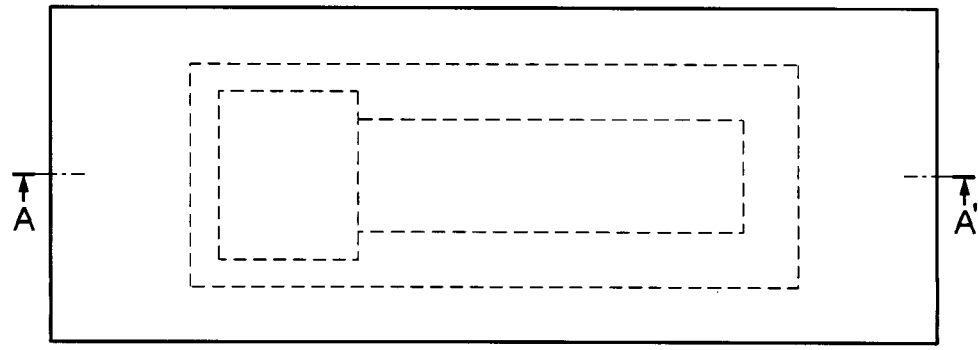

As shown in FIGS. 5A and 5B, over the whole top surface of the substrate 202, a support precursor layer 342 composed of a silicon oxide film is formed by chemical vapor deposition (CVD). The thickness of the support precursor layer 342 is preferably about 400 nm. Here, a silicon nitride film may be used instead of the silicon oxide film.

Figure 6A:
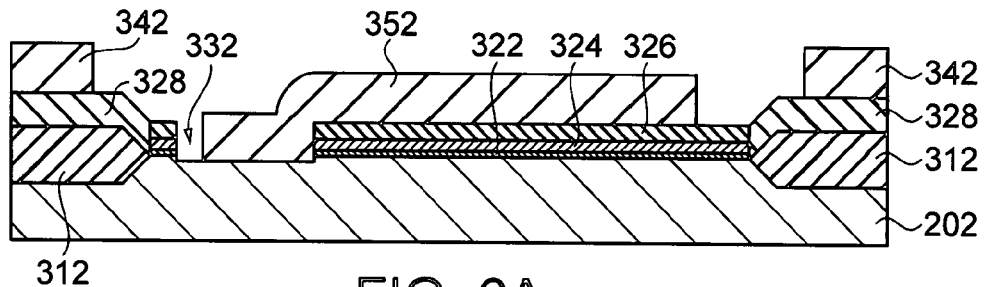
FIGS. 6A and 6B are schematic views showing a process of manufacturing a semiconductor device of the embodiment.
Figure 6B:
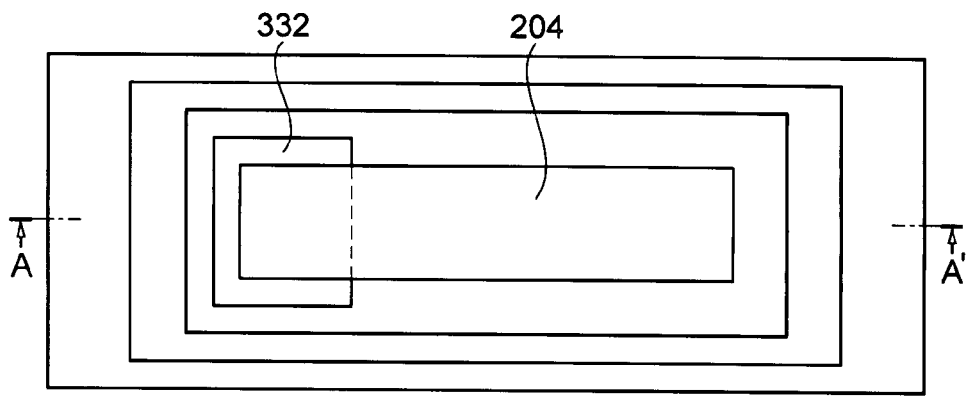

As shown in FIGS. 6A and 6B, a part of the support precursor layer 342 is removed by photolithography so as to form a support 352 on the single-crystalline silicon layer 326. The part of the support precursor layer 342 excludes a part thereof corresponding to the SOI forming region 204 and at least a part, adjacent to the SOI forming region 204, of the bottom part of the recess 332. The support 352 connects with the substrate 202 through the recess 332. Since the recess 332 includes only one side part of the support 352, that is the side part adjacent to one short side of the SOI forming region 204, the support 352 supports the single-crystalline silicon layer 326 from the top only by one side part thereof, in a cantilever state.

Here, the support precursor layer 342 is preferably left on the LOCOS layer 312 in the photolithography process. In a chemical mechanical polishing (CMP) process mentioned later, the support precursor layer 342 which is left restrains the LOCOS layer 312 from being polished.

Figure 7A:
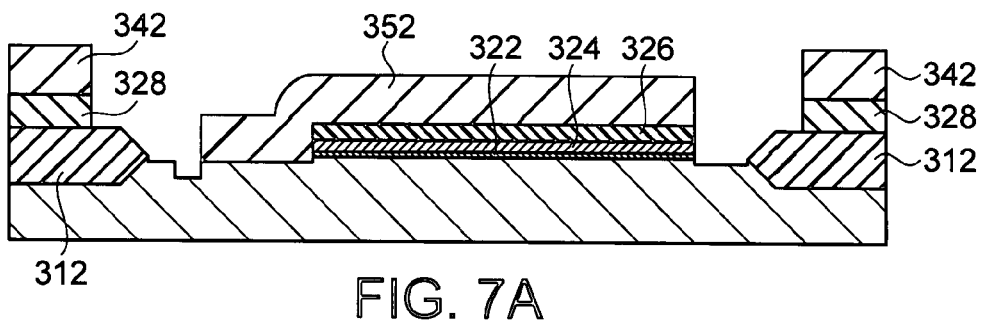
FIGS. 7A and 7B are schematic views showing a process of manufacturing a semiconductor device of the embodiment.
Figure 7B:
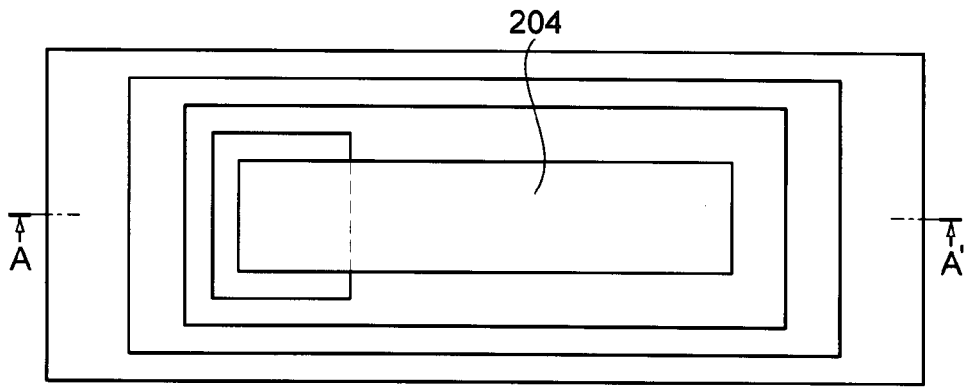

As shown in FIGS. 7A and 7B, the single-crystalline silicon layer 326, the single-crystalline silicon-germanium layer 324, and the buffer layer 322 are subjected to anisotropic dry-etching by using the support 352 and the support precursor layer 342 left on the LOCOS layer 312 as a mask. Other than one side section on the short side of the SOI forming region 204 adjacent to the recess 332, side sections of the three-layered single-crystalline semiconductor layer stacked on the SOI forming region 204 are exposed. Here, a part of the substrate 202 is slightly etched in this process, but there is no problem.

Figure 8A:
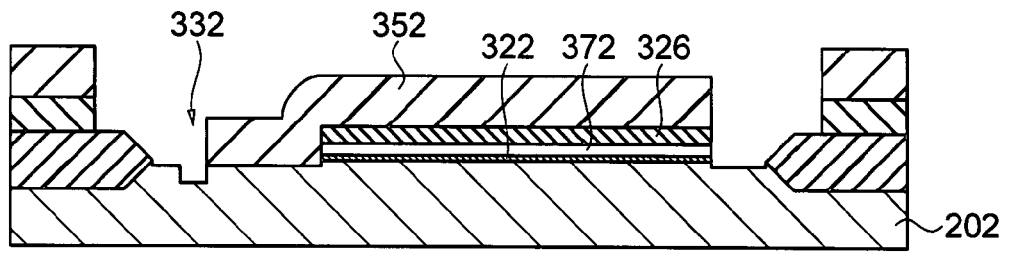
FIGS. 8A and 8B are schematic views showing a process of manufacturing a semiconductor device of the embodiment.
Figure 8B:
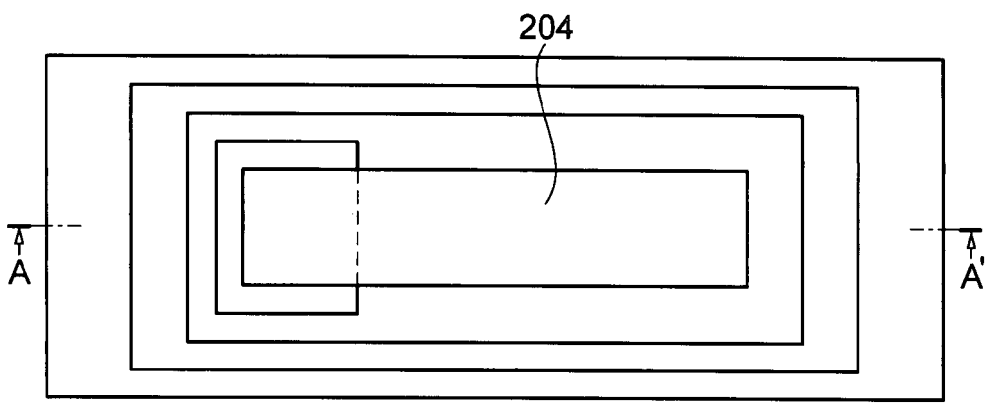

As shown in FIGS. 8A and 8B, hydrofluoric nitric acid (compound liquid of hydrofluoric acid, nitric acid, and water) as an etchant is allowed to act on the side sections of the three-layered single-crystalline semiconductor layer on the SOI forming region 204 so as to form a cavity 372 between the single-crystalline silicon layer 326 and the buffer layer 322. Since the single-crystalline silicon-germanium layer 324 can be etched by the hydrofluoric nitric acid (compound liquid of hydrofluoric acid, nitric acid, and water) as an etchant in higher selective ratio than the single-crystalline silicon layer 326, the cavity 372 can be formed without reducing the film thickness of the single-crystalline silicon layer 326. Further, since the width (short side) of the SOI forming region 204 is 1.25 µm or less and the recess 332 is formed adjacent to the short side of the SOI forming region 204, the etchant can surely infiltrate from the both sides (from the both long sides) to remove the single-crystalline silicon-germanium layer 324 completely. Thus, the entire lower layer of the single-crystalline silicon layer 326 becomes the cavity 372, that is, the single-crystalline silicon layer 326 is suspended by the support 352 of which one end part connects with the substrate 202 through the recess 332, like a cantilever.

Here, fluoro nitric acid hydrogen peroxide water, ammonia hydrogen peroxide water, and the like may be used as the etchent for the single-crystalline silicon-germanium layer 324. Further, the etching is not limited to the wet-etching.

Figure 9A:
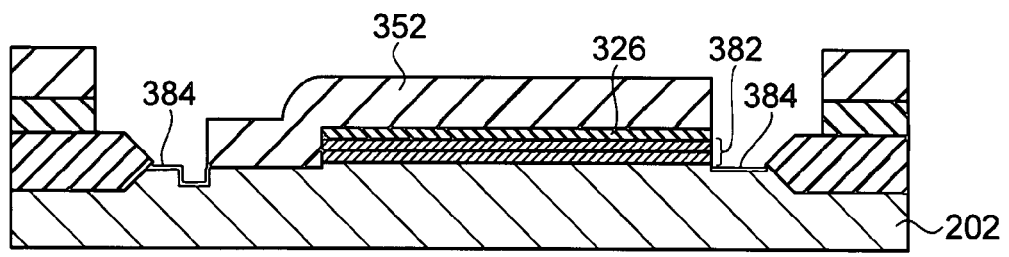
FIGS. 9A and 9B are schematic views showing a process of manufacturing a semiconductor device of the embodiment.
Figure 9B:
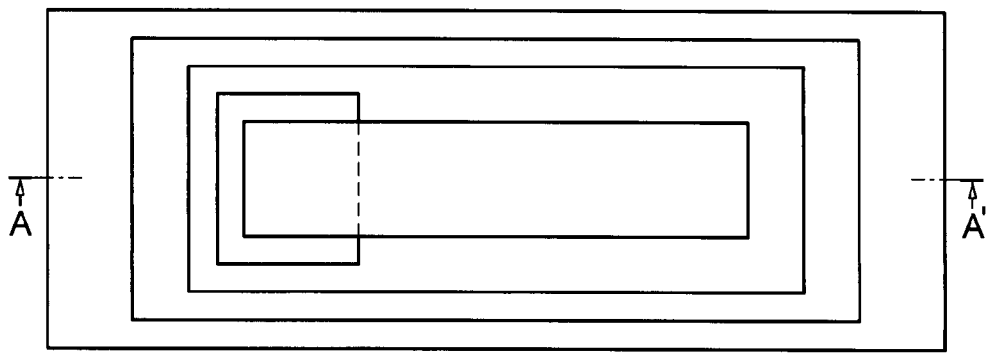

As shown in FIGS. 9A and 9B, the top surface of the buffer layer 322 and the bottom surface of the single-crystalline silicon layer 326 which sandwich the cavity 372 from top and bottom are thermally oxidized so as to form a buried insulating layer 382 composed of silicon oxide films. Since the support 352 is formed over the top surface of the single-crystalline silicon layer 326, the buried insulating layer 382 can be formed without thermally oxidizing the top surface of the single-crystalline silicon layer 326, being able to prevent film reduction of the single-crystalline silicon layer 326.

Here, the buffer layer 322 is thin as 20 nm. Therefore, after the buffer layer 322 is entirely oxidized, the surface of the substrate 202 is oxidized to be a part of the buried insulating layer 382. When the buffer layer 322 is not used, the surface of the substrate 202 is oxidized directly to be the buried insulating layer 382 along with the silicon oxide film grown from the single-crystalline silicon layer 326.

As described above, compressive stress occurs within the support 352. However, as described later, since the support 352 connects with the substrate 202 with one short side part thereof, the compressive stress occurring within the support 352 in heating does not work as warping the support 352 upward, but works as pressing the support 352 downward to the substrate 202 (refer to FIG. 13B). Therefore, the silicon oxide films grown from top and bottom completely adhere to each other to integrate, becoming the buried insulating layer 382 having no gap therein, in the cavity 372. Here, when forming the buried insulating layer 382, the surface, exposed around the support 352, of the substrate 202 is also oxidized to be a silicon oxide film 384, but there is no problem.

Figure 10A:
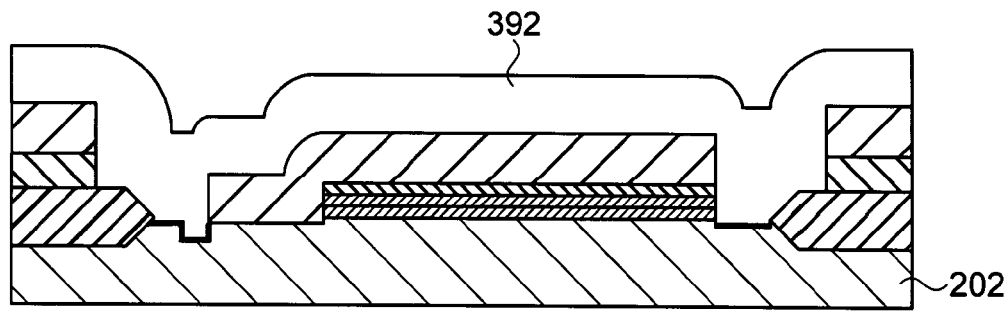
FIGS. 10A and 10B are schematic views showing a process of manufacturing a semiconductor device of the embodiment.
Figure 10B:
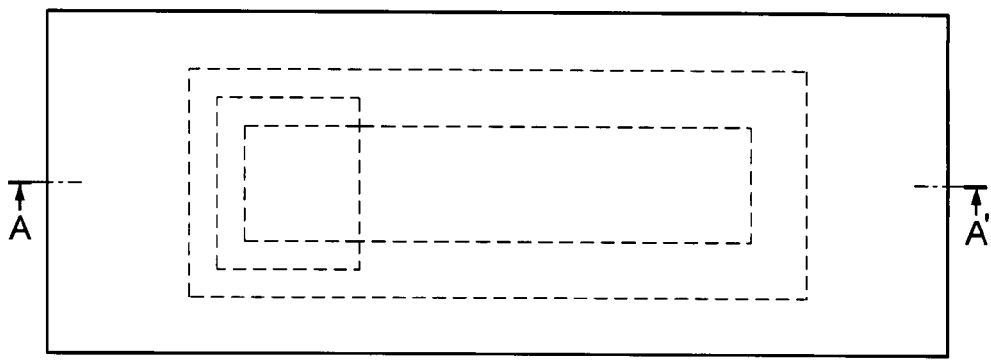

As shown in FIGS. 10A and 10B, over the whole surface of the substrate 202, a planarized insulating layer 392 composed of a silicon oxide film is formed by CVD. The thickness of the planarized insulating layer 392 is preferably about 1000 nm. Silicon nitride film may be used instead of the silicon oxide film.

Figure 11A:
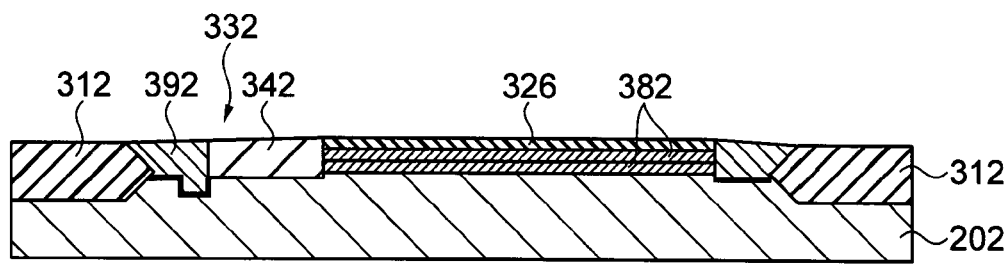
FIGS. 11A and 11B are schematic views showing a process of manufacturing a semiconductor device of the embodiment.
Figure 11B:
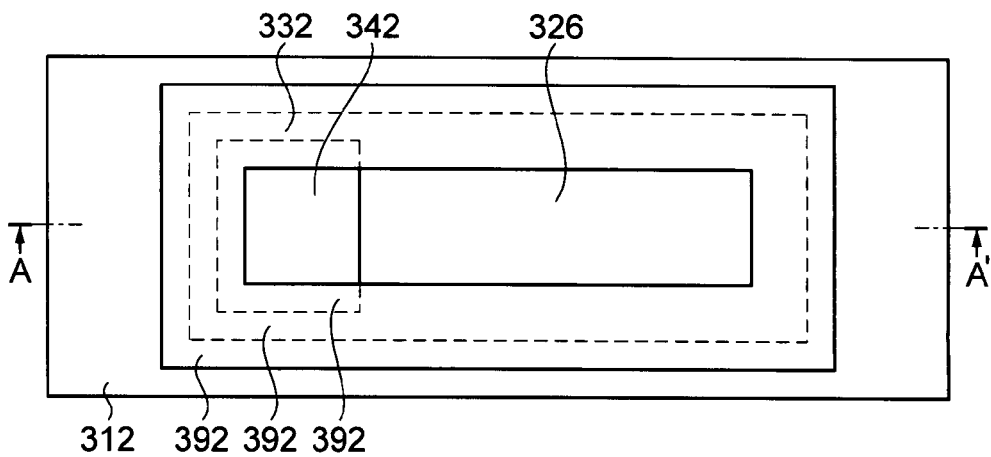

As shown in FIGS. 11A and 11B, parts of the support 352, the planarized insulating layer 392, and the support precursor layer 342 on the LOCOS layer 312 are removed by CMP or the like so as to expose the single-crystalline silicon layer 326. Here, the support 352 (the support precursor layer 342) is left in the recess 332.

The above processes form the single-crystalline silicon layer 326 surrounded its periphery by the support precursor layer 342 (including the support 352) and the planarized insulating layer 392, insulated from the substrate 202 by the buried insulating layer 382, and electrically isolated by the LOCOS layer 312.

As mentioned above, the buried insulating layer 382 according to the embodiment has no gap therein, so that, in the order from the bottom, the substrate 202, the buried insulating layer 382, and the single-crystalline silicon layer 326 are integrated. Therefore, a hydrofluoric acid solution does not infiltrate in the CMP process, the SOI structure can be stably formed on the semiconductor substrate.

Figure 12A:
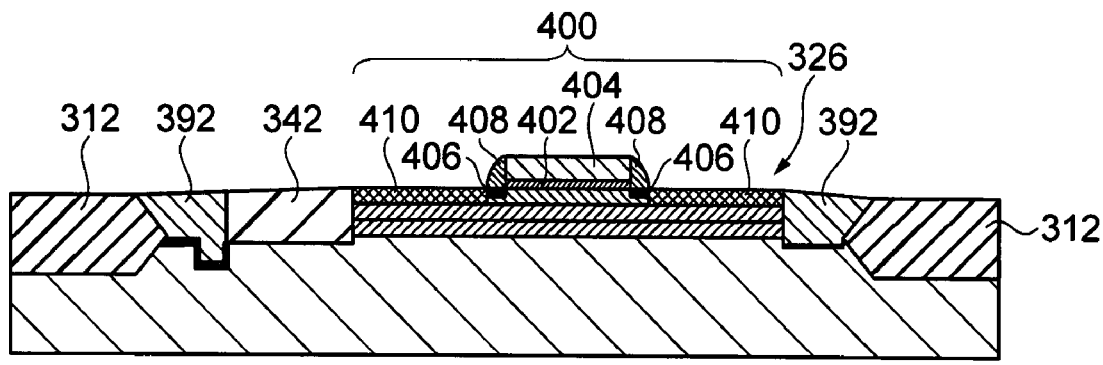
FIGS. 12A and 12B are schematic views showing a process of manufacturing a semiconductor device of the embodiment.
Figure 12B:
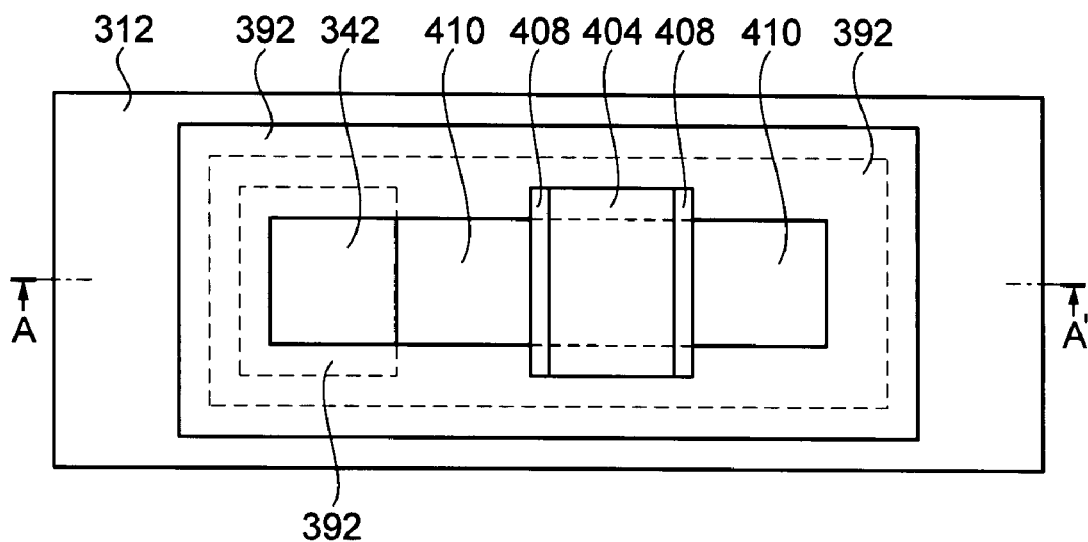

Finally, as shown in FIGS. 12A and 12B, a semiconductor device 400 is formed by using the single-crystalline silicon layer 326. First, the surface of the single-crystalline silicon layer 326 is thermally oxidized so as to form a gate insulating film 402 thereon. Then, a polycrystalline silicon layer is formed on the gate insulating film 402 by CVD or the like. The polycrystalline silicon layer is patterned by photolithography so as to form a gate electrode 404. Through the known processes hereafter, the semiconductor device 400 is formed. In particular, ions of impurities such as arsenic (As), phosphorus (P), boron (B), and the like are implanted into the single-crystalline silicon layer 326 by using the gate electrode 404 as a mask so as to form LDD layers 406 composed of low concentration impurity introduction layers on lateral areas of the gate electrode 404. Then an insulating layer is formed on the gate electrode 404 by CVD and etched back by anisotropic etching such as reactive ion etching (RIE) so as to form side walls 408. Then ions of impurities such as As, P, B, and the like are implanted into the single-crystalline silicon layer 326 by using the gate electrode 404 and the side walls 408 as a mask so as to form source/drain layers 410 composed of a high concentration impurity introduction layer on the lateral areas of the side walls 408. Thus, the semiconductor device 400 is formed.

The support 352 is cantilevered as mentioned above, so that the SOI structure can be easily formed on the semiconductor substrate. Therefore, semiconductor devices such as a high-performance field-effect transistor and the like can be stably manufactured.

Figure 13A:
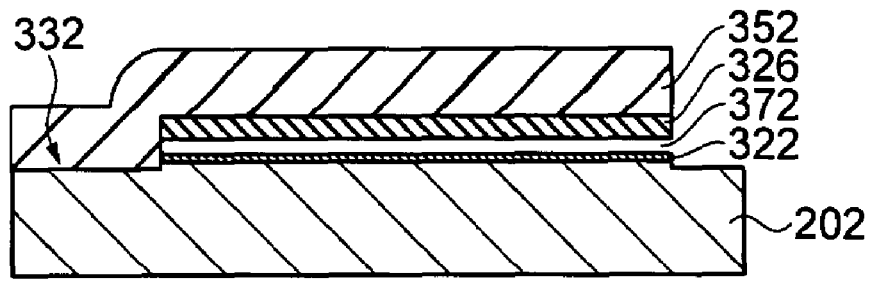
FIGS. 13A to 13C are schematic views showing a state of a support in forming a buried insulating layer of the embodiment.
Figure 13B:
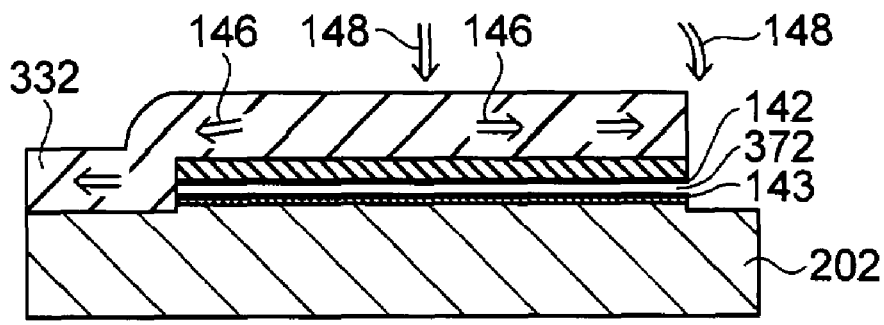
Figure 13C:
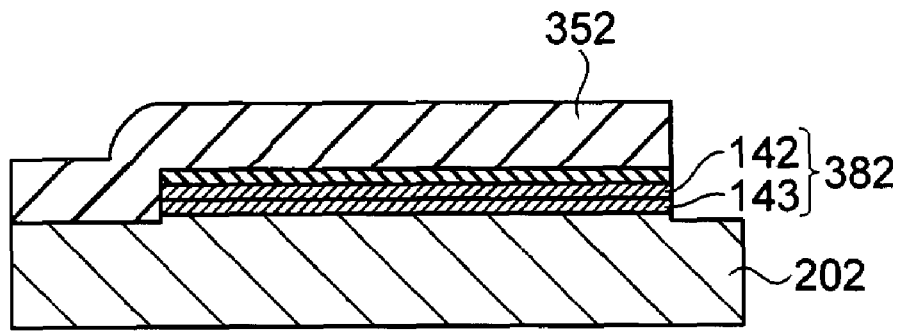

FIGS. 13A to 13C show a state of the support 352 in forming the buried insulating layer 382 according to the embodiment. FIG. 13A is identical to a part of FIG. 8A showing the state of the substrate 202 subjected to the following process: forming the buffer layer 322, the single-crystalline silicon layer 326, and the single-crystalline silicon-germanium layer which is not shown provided to the SOI forming region 204 of the substrate 202; covering the top surface of the substrate 202 by the support 352 connecting with the substrate 202 through the recess 332 adjacent to one short side of the SOI forming region 204 so as to support the single-crystalline silicon layer 326; and selectively etching the single-crystal silicon-germanium layer so as to form the cavity 372 under the single-crystalline silicon layer 326. The removing process of the single-crystalline silicon-germanium layer generates no stress, so that the singe-crystalline silicon layer 326 is flat.

FIG. 13B shows a state of starting thermal oxidation of the single-crystalline silicon layer 326 being the upper layer of the cavity 372 and the buffer layer 322 being the lower layer of the cavity 372 so as to form the buried insulating layer 382 composed of silicon oxide films in the cavity 372. Two layers, i.e. a silicon oxide film 142 and a silicon oxide film 143 are formed respectively from the upper layer and the lower layer of the cavity 372. At the same time, compressive stress 146, that is a force stretching the support 352 in the horizontal direction occurs within the support 352.

Figure 14A:
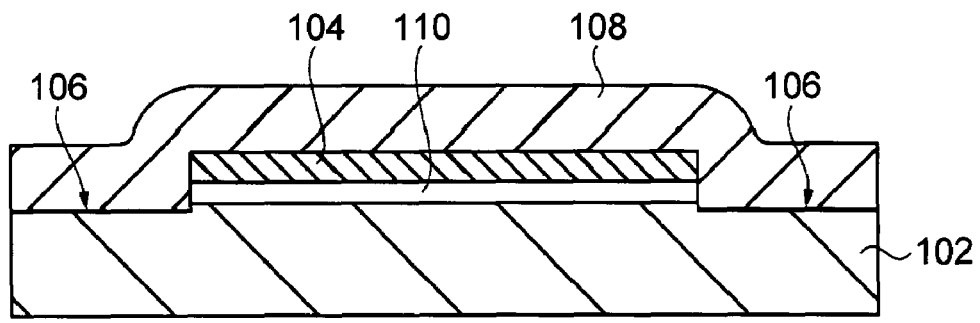
FIGS. 14A to 14C are schematic views showing a state of generation of a gap in forming an SOI structure by a conventional method.
Figure 14B:
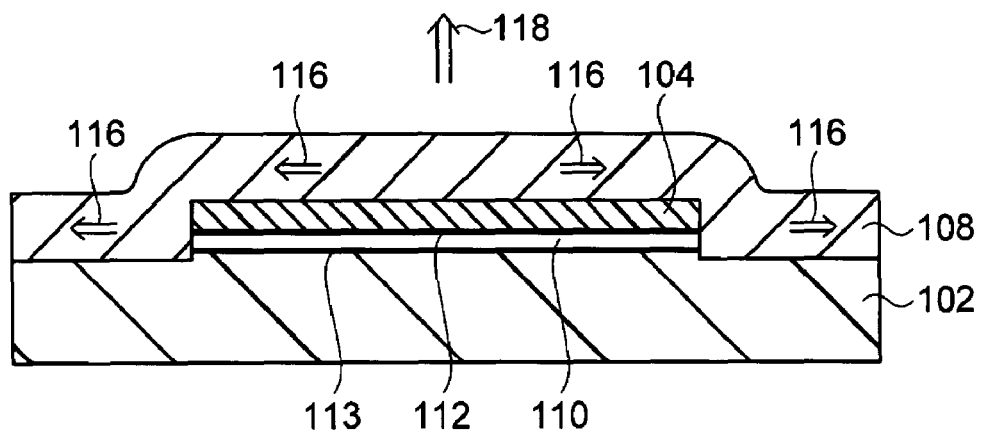
Figure 14C:
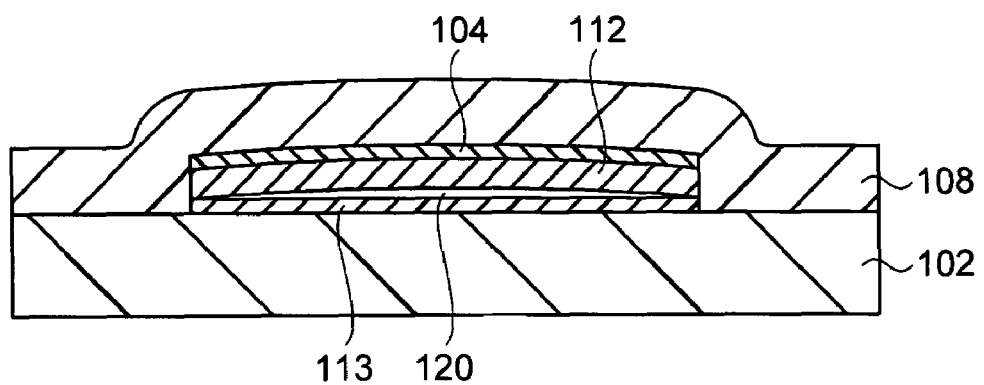

Here, one side part of the support 352 of the embodiment connects with the substrate 202 through the recess 332, and the other side part thereof is open. A force stretching the support 352 occurs in such manner that the one side part of the support 352 is fixed and the other side part is open. Therefore, the force occurring is in such state as rotating the whole support 352 downward while using the fixed side part as a supporting point. Thus, the direction of a force 148 applied to the support 352 and the single-crystalline silicon layer 326 turns to such direction as pressing the support 352 downward, which is different from the conventional art shown in FIG. 14B.

FIG. 13C shows a state that the buried insulating layer 382 is completed after the thermal oxidation. The oxidation progresses with the force pressing one end part of the support 352 downward, so that the silicon oxide film 142 formed (grown) from the top and the silicon oxide film 143 formed (grown) from the bottom adhere firmly to each other to become the buried insulating layer 382 having no gap therein.

First Modification

In the embodiment, the buffer layer 322 made of single-crystalline silicon is formed under the single-crystalline silicon-germanium layer 324 which is the first semiconductor layer. The buffer layer 322 prevents defects and the like which may be on the surface of the substrate 202 from adversely affecting the single-crystalline silicon layer 326, and has no direct relation with the compressive stress occurring within the support 352. Therefore, the single-crystalline silicon-germanium layer 324 may be directly formed on the substrate 202 without forming the buffer layer 322 in the embodiment.

Second Modification

In the embodiment, the LOCOS layer 312 is formed between the SOI forming regions 204 so as to electrically isolate respective semiconductor devices, but other means such as trench structure may be adopted to isolate the respective semiconductor devices. Alternatively, the region including the planarized insulating layer 392 of the embodiment can be expanded so as to electrically isolate the respective semiconductor devices.

Third Modification

In the embodiment, the recess 332 is formed adjacent to the short side of the region in which the SOI structure is to be formed, but the recess 332 may be formed adjacent to one long side. When the width of the region in which the SOI structure is to be formed is 1.25 µm or less, the etchant can infiltrate sufficiently from the both sides to form the cavity 372 completely. Therefore, in forming the SOI structure having the width of 0.625 µm or less which is the half width of 1.25 µm, even if the recess 332 is formed adjacent to the long side, the SOI structure completely insulated from the substrate 202 can be provided.

Fourth Modification

In the embodiment, the planar shape of the SOI forming region is rectangular. However, the shape of the SOI forming region in the embodiment is not limited. The planar shape of the SOI forming region may be set in accordance with the planar shape of the semiconductor device which is the final purpose. Therefore, the SOI forming region may be trapezoid, for example.

The entire disclosure of Japanese Patent Application No: 2006-202914, filed Jul. 26, 2006 is expressly incorporated by reference herein.

What is claimed is:

1. A method for manufacturing a semiconductor device, comprising:
    forming a buffer layer made of single-crystalline silicon on a semiconductor substrate including a first region, the first region being arranged at a predetermined interval for providing a silicon on insulator (SOI) structure;
    after forming the buffer layer, forming a first semiconductor layer on the buffer layer;
    forming a second semiconductor on the first semiconductor layer;
    removing the first semiconductor layer, the second semiconductor layer, and the buffer layer from a second region, the second region being adjacent to the first region via one line and disposed singly to each of the first region, so as to form a recess for a support, the recess exposing the semiconductor substrate;
    forming a support precursor layer made of an insulating material on a region including at least the first region and the second region on the semiconductor substrate;
    etching and removing the support precursor layer except for a part thereof corresponding to the first region and corresponding to a part, the part including at least the one line, of a bottom part of the recess so as to form a support coupling the recess and the second semiconductor layer;
    etching a part of the first semiconductor layer and the second semiconductor layer by using the support as a mask to expose a first side section of the first semiconductor layer and the second semiconductor layer except for a second side section adjacent to the second region;
    etching and removing the first semiconductor layer selectively to the second semiconductor layer and the semiconductor substrate so as to form a cavity under the second semiconductor layer, wherein the cavity is formed between the second semiconductor layer and the buffer layer, the second semiconductor layer being an upper layer of the cavity and the buffer layer being a lower layer of the cavity;
    thermally oxidizing the second semiconductor layer and the buffer layer so as to form a buried insulating layer composed of a semiconductor oxide film in the cavity; and
    removing the support at least from the first region so as to expose the second semiconductor layer.

2. The method for manufacturing a semiconductor device according to claim 1, wherein a planar shape of the first region is rectangular, and the one line is one short side out of four sides defining the first region.

3. The method for manufacturing a semiconductor device according to claim 2, wherein a length of the short side is 1.25 µm or less.

4. The method for manufacturing a semiconductor device according to claim 1, wherein the semiconductor substrate and the second semiconductor layer are made of single-crystalline silicon, and the first semiconductor layer is made of single-crystalline silicon-germanium.

* * * * *